(12) United States Patent
Kimura et al.

(10) Patent No.: US 7,572,039 B2
(45) Date of Patent: Aug. 11, 2009

(54) PORCELAIN ENAMEL SUBSTRATE FOR MOUNTING LIGHT EMITTING DEVICE AND METHOD OF MANUFACTURING THE SAME, LIGHT EMITTING DEVICE MODULE, ILLUMINATION DEVICE, DISPLAY UNIT AND TRAFFIC SIGNAL

(75) Inventors: Naoki Kimura, Sakura (JP); Masakazu Ohashi, Sakura (JP); Shunichirou Hirafune, Sakura (JP)

(73) Assignee: Fujikura, Ltd., Tokyo (JP)

( * ) Notice: Subject to any disclaimer, the term of this patent is extended or adjusted under 35 U.S.C. 154(b) by 0 days.

(21) Appl. No.: 11/950,904

(22) Filed: Dec. 5, 2007

(65) Prior Publication Data

US 2008/0079018 A1   Apr. 3, 2008

Related U.S. Application Data

(63) Continuation of application No. PCT/JP2006/311093, filed on Jun. 2, 2006.

(30) Foreign Application Priority Data

Jun. 7, 2005 (JP) .............................. 2005-167499

(51) Int. Cl.
*F21S 8/08* (2006.01)
(52) U.S. Cl. ...................................... 362/411; 362/800
(58) Field of Classification Search ................. 362/411, 362/800
See application file for complete search history.

(56) References Cited

U.S. PATENT DOCUMENTS

| | | | | |
|---|---|---|---|---|
| 4,256,796 A | * | 3/1981 | Hang et al. ................. | 428/210 |
| 5,043,526 A | * | 8/1991 | Nakagawa et al. .......... | 174/250 |
| 5,054,894 A | * | 10/1991 | Warszawski ................ | 359/270 |
| 6,096,569 A | | 8/2000 | Matsuno et al. | |
| 2002/0057571 A1 | * | 5/2002 | Osumi et al. ................ | 362/298 |
| 2003/0219919 A1 | * | 11/2003 | Wang et al. .................. | 438/26 |
| 2005/0122018 A1 | | 6/2005 | Morris | |

FOREIGN PATENT DOCUMENTS

| | | |
|---|---|---|
| JP | 58-500880 A | 5/1983 |
| JP | 59-009982 A | 1/1984 |
| JP | 62-084942 U | 5/1987 |
| JP | 62-84942 U | 5/1987 |
| JP | 62-099166 A | 5/1987 |
| JP | 62-99166 A | 5/1987 |
| JP | 62-261192 A | 11/1987 |
| JP | 62261192 A | 11/1987 |
| JP | 64-27291 A | 1/1989 |

(Continued)

*Primary Examiner*—Ali Alavi
*Assistant Examiner*—William J Carter
(74) *Attorney, Agent, or Firm*—Sughrue Mion, PLLC

(57) ABSTRACT

A porcelain enamel substrate mounts a light emitting device in which a porcelain enamel layer is coated onto a surface of a core metal, and a reflective cup portion that has a flat bottom surface and a sloping portion that surrounds this bottom surface is provided on a light emitting device mounting surface, and an electrode for energizing a light emitting device is provided on the light emitting device mounting surface, and the thickness of the electrode within the reflective cup portion is within a range of 5 μm to 100 μm.

3 Claims, 1 Drawing Sheet

FOREIGN PATENT DOCUMENTS

| | | |
|---|---|---|
| JP | 64-027291 A | 1/1989 |
| JP | 03-036049 A | 2/1991 |
| JP | 3-36049 A | 2/1991 |
| JP | 07-085721 A | 3/1995 |
| JP | 7-85721 A | 3/1995 |
| JP | 8-295005 A | 11/1996 |
| JP | 09-246694 A | 9/1997 |
| JP | 9-246694 A | 9/1997 |
| JP | 2005-175427 A | 6/2005 |
| JP | 2006-147865 A | 6/2006 |
| TW | 220282 | 5/2002 |
| WO | 83/00408 A1 | 2/1983 |
| WO | WO 83/00408 A1 | 2/1983 |

\* cited by examiner

PORCELAIN ENAMEL SUBSTRATE FOR MOUNTING LIGHT EMITTING DEVICE AND METHOD OF MANUFACTURING THE SAME, LIGHT EMITTING DEVICE MODULE, ILLUMINATION DEVICE, DISPLAY UNIT AND TRAFFIC SIGNAL

Priority is claimed from Japanese Patent Application No. 2005-167499, filed Jun. 7, 2005, the contents of which are incorporated herein by reference.

TECHNICAL FIELD

Apparatuses and methods consistent with the present invention relate to a porcelain enamel substrate for mounting a light emitting device that is used for mounting a plurality of individual light emitting devices such as light emitting diodes (referred to below as LED), and particularly to a porcelain enamel substrate for mounting a light emitting device in which dimensional accuracy and heat discharge performance are improved when light emitting devices are mounted at a high density in applications such as illumination devices and to a method of manufacturing the same, and to a light emitting device module that is formed by mounting light emitting devices on a substrate, and to an illumination device that has this light emitting device module, and to a display unit and a traffic signal.

DESCRIPTION OF THE RELATED ART

In recent years, in methods of manufacturing light emitting device modules such as LED units, a method known as a Chip-On-Board method in which light emitting devices are mounted directly onto an electronic circuit board has become mainstream. This method has the advantage that, compared with a method in which a number of light emitting devices such as round-type LED and surface mount-type LED are mounted on an electronic circuit board, no semi-finished product processing is required and the structure can also be simplified.

On the other hand, light emitting devices are used in illumination devices, as the backlights for liquid crystal image devices, and in traffic signals and the like, and there are demands for even greater improvements in the light emission intensity. By increasing the amount of current that is applied thereto, it is possible to raise the emission intensity of the light emitting devices, however, in this case, because the light emitting devices also generate heat at the same time, efficient heat discharge is also required. If there is insufficient heat discharge, the light emitting device becomes extremely hot when it is turned on and there is a deterioration in the light emission efficiency. Consequently, it is not possible to obtain the desired light emission intensity.

Moreover, if the light emitting devices are used for an extended period of time, there is a reduction in the reliability of the light emitting devices, and there is a strong possibility that malfunctions will occur such as the light emitting devices failing to turn on.

When a light emitting device is mounted on a circuit board, in order for light generated by the light emitting device to be efficiently discharged forwards, it is desirable for a bowl-shaped reflective cup portion that has a sloping reflective surface such as is shown in FIG. 1 to be provided, and to mount the light emitting device on a bottom surface thereof. By forming the reflective cup portion in a bowl shape, it is possible to control the light direction and to also furnish the reflective cup portion with the role of holding resin for sealing the light emitting device.

In view of these demands, consideration has been given to circuit boards that use porcelain enamel substrates which have excellent light extraction efficiency and can be produced at low cost as substrates for a light emitting device mount. FIG. 1 is a cross-sectional view showing an example of a light emitting device module that uses this porcelain enamel substrate. This light emitting device module 2 is provided with a porcelain enamel substrate 1 mounting a light emitting device that is formed by covering a surface of a core metal 4 which is formed from a low carbon steel sheet with a porcelain enamel layer 5 which is formed from glass. A bowl-shaped reflective cup portion 7 is provided in this porcelain enamel substrate 1, and electrodes 6 for energizing the light emitting device 3 are provided on the light emitting device mounting surface on which the reflective cup portion 7 is provided. A light emitting device 3 such as an LED is mounted on a bottom surface of the reflective cup portion 7 of this substrate. The light emitting device 3 is mounted on one of the pair of electrodes 6 and 6 that extend as far as the bottom surface of the reflective cup portion 7, while being electrically connected by a metal wire 8 to the other electrode. The reflective cup portion 7 on which the light emitting device 3 is mounted is sealed by a sealing resin 9.

This porcelain enamel substrate can be formed in a desired shape by working a core metal, and then forming a porcelain enamel layer which is formed from glass on the surface thereof matching this shape. Therefore, electrical insulation can be secured while the desired shape is achieved.

In the case of a porcelain enamel substrate that has a reflective cup structure such as that shown in FIG. 1, it is necessary to perform processing to make the core metal thereof match the shape of the reflective cup structure. Examples of this processing method include processing using a drill and drawing processing using a metal press, however, press working is desirable from the standpoints of productivity and processing costs. After the metal has been press-worked, a non-conductive material such as glass is superimposed thereon so as to form an electrode that mounts a light emitting device or an electrode that makes an electrical circuit on the substrate. As a result, a porcelain enamel substrate mounting a light emitting device is obtained.

Methods in which etching is performed or in which a conductive paste print is made are also used as a method of forming electrodes on a substrate that has a reflective cup structure. Because electrode formation by etching is expensive, the printing method is currently the most common method.

When a porcelain enamel substrate having the reflective cup structure shown in FIG. 1 is manufactured, after a non-conductive material such as glass has been superimposed, an electrode that mounts a light emitting device or an electrode that makes an electrical circuit is formed. At this time, if the electrode is thick, then the flatness thereof is poor and the problem arises that, even if the non-conductive layer is flat, the electrode ends up not being flat. In particular, if the electrode is not flat in those locations where a light emitting device is mounted, then a serious problem arises in that a number of malfunctions occur in the mounting step such as there being a deterioration in adhesiveness after the light emitting device has been mounted. Moreover, if an electrode is printed using silver paste or the like, the problem arises that a thick electrode causes the cost thereof to increase. On the other hand, if the electrode is thin, there is a deterioration in thermal conductivity and particularly in thermal conductivity in a direction parallel to the substrate, and it has been found that a satisfactory heat discharge performance cannot be obtained. If the heat discharge is insufficient, the light emitting device becomes extremely hot when it is turned on, which results in a deterioration in the light emission efficiency. Consequently, it is not possible to obtain the desired light emission intensity. Moreover, if the light emitting device is used for an extended period of time, there is a reduction in the reliability of the light emitting device, and there is a strong possibility that malfunctions will occur such as the light emitting devices failing to turn on. In addition, if there are portions where the glass layer is exposed, the reflectivity in those portions is poor so that the problem arises that there is an overall reduction in the amount of light that is discharged.

In contrast, when an electrode is being formed on a substrate that has a reflective cup shape, in normal screen printing the problem arises that printing is not possible if recessed portions are too deep. Printing using an ink jet system such as an inkjet printer or the like is one possibility, however, in an ink jet system it is necessary for the direction of the ink jetting to be perpendicular to the printed surface. Because of this, this system is not necessarily suitable for printing a substrate which has a cup shape such as is described above, and the problem arises that complex solutions are needed in order to print the sloping surfaces and the bottom surface to the same thickness.

A pad printing device is able to print inner surfaces of this type of recessed portion. A pad printing device uses a medium known as a pad which has elasticity and is used for transferring ink in order to perform printing by transferring ink, which has flowed into recessed portions as a result of ink being coated onto a print surface in which recessed portions are formed in accordance with the image being printed, onto a print object. Because this type of pad is used, a pad printing device has the feature that it is able to print not only onto a flat surface but also onto a curved surface. By making use of this feature of the pad printing method, it is possible to form electrodes on an inner surface side of a bowl-shaped reflective cup portion. However, even in this type of pad printing method, if the reflective cup portion is too deep or if the slope angle of the wall surfaces is too steep, as is shown in FIG. 2, boundary portions between the sloping surfaces and the bottom surface of the reflective cup portion 7 cannot be printed properly, and the problem arises that the bottom surface is not level.

SUMMARY

Exemplary embodiments of the present invention were conceived in view of the above described circumstances, and it is an object thereof to provide a porcelain enamel substrate mounting a light emitting device that has excellent heat discharge properties and in which the bottom surface of the reflective cup portion has excellent flatness, as well as a method of manufacturing the same, and to also provide a light emitting device module in which light emitting devices are mounted on this substrate, an illumination device which has this light emitting device module, a display unit, and a traffic signal.

According to one exemplary embodiment, there is provided a porcelain enamel substrate for mounting a light emitting device that includes: a core metal; a porcelain enamel layer that is coated onto a surface of the core metal; a reflective cup portion that is provided on a light emitting device mounting surface, and has a flat bottom surface and a sloping portion that surrounds this bottom surface; and an electrode for energizing the light emitting device that is provided on the light emitting device mounting surface, and whose thickness within the reflective cup portion is within a range of 5 μm to 100 μm.

According to the first exemplary embodiment, above, it is preferable for the thickness of the electrode within the reflective cup portion to be within a range of 5 μm to 50 μm.

According to a second exemplary embodiment, there is provided a method of manufacturing a porcelain enamel substrate for mounting a light emitting device that includes: a step in which a porcelain enamel layer is formed by baking a porcelain enamel material onto a core metal that is obtained by forming a reflective cup portion that has a flat bottom surface and a sloping portion that surrounds this bottom surface in a metal material; and a step in which an electrode for energizing a light emitting device is formed on the light emitting device mounting surface on which the reflective cup portion is provided such that the thickness of the electrode within the reflective cup portion is within a range of 5 μm to 100 μm.

According to the second exemplary embodiment, above, it is preferable for the electrode to be formed by printing a conductive paste onto the porcelain enamel layer using a pad printing method and then baking the conductive paste. Further, it is preferable for smoothing of the electrode to be performed after the electrode inside the reflective cup portion has been baked.

According to a third exemplary embodiment, there is provided a light emitting device module that includes: the porcelain enamel substrate for mounting the light emitting device according to the present invention; and the light emitting device that is mounted on the porcelain enamel substrate for mounting the light emitting device.

According to a fourth exemplary embodiment, there is provided an illumination device, a display unit, and traffic signal that have the light emitting device module according to the present invention.

Because the thickness of the electrode inside the cup reflective portion in the porcelain enamel substrate for mounting a light emitting device, above, is within a range of 5 μm to 100 μm, it is possible to provide a light emitting device module which is excellent when considered from any of the standpoints of heat discharge performance, flatness of the reflective cup portion, and the amount of emitted light.

According to the second exemplary embodiment, above, by additionally performing a smoothing step in order to regularize the shape of the electrode within the reflective cup portion after the electrode has been sintered, an even better heat discharge performance, flatness of the reflective cup portion, and light emission amount can be obtained.

Because the light emitting device module of the third exemplary embodiment is formed by mounting a light emitting device on the above described porcelain enamel substrate, it is possible to provide a light emitting device module that provides an excellent substrate heat discharge performance and that emits a large amount of light.

DETAILED DESCRIPTION OF EXEMPLARY EMBODIMENTS OF THE INVENTION

Figure 1:
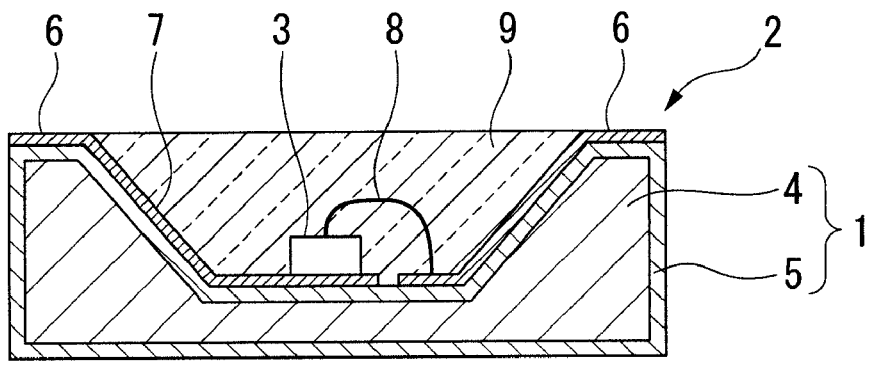
FIG. 1 is a cross-sectional view showing an example of the structure of a light emitting device module.
Figure 2:
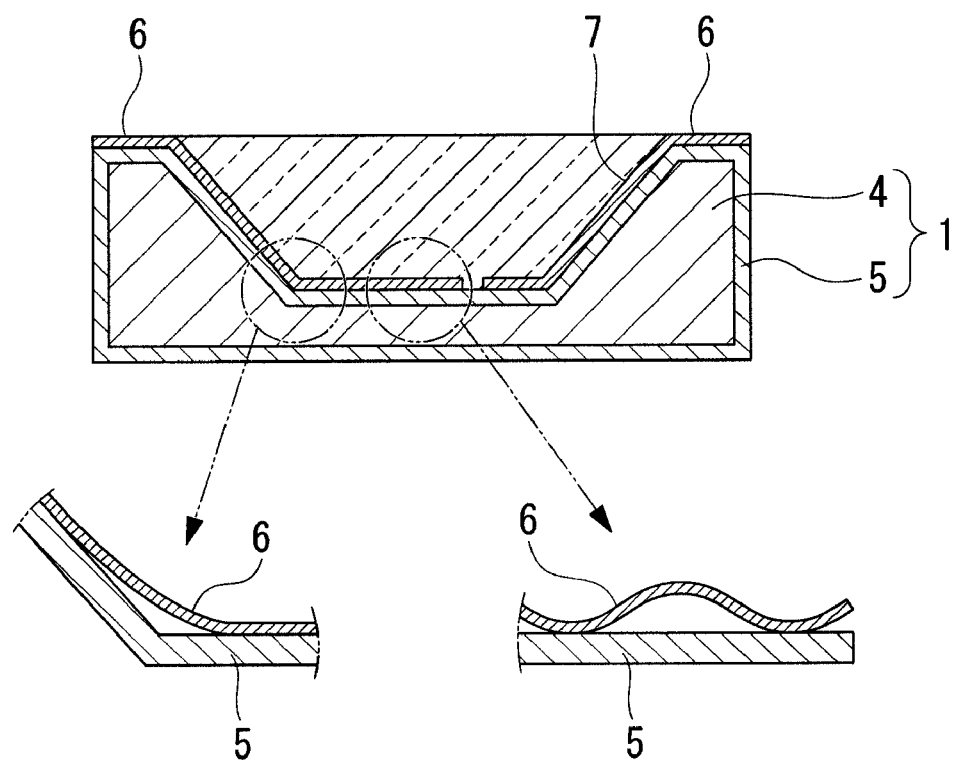
FIG. 2 is a cross-sectional view illustrating causes for a deterioration in the degree of flatness of an electrode that arise when the electrode is being formed.

As is shown in FIG. 1, in a porcelain enamel substrate 1 mounting a light emitting device which has a reflective cup portion 7 on a light emitting device mounting surface, provides an optimum range for the thickness of at least that portion of an electrode 6, which is formed on the light emitting device mount surface, that is formed by being baked onto the reflective cup portion 7. The exemplary embodiment is characterized by the fact that the thickness of the electrode 6 within the reflective cup portion 7 is within a range of 5 μm to 100 μm, and is preferably within a range of 5 μm to 50 μm. As a result of this, it is possible to obtain a substrate which is excellent when considered from any of the standpoints of heat discharge performance, flatness of the reflective cup portion, and the amount of emitted light. If the thickness of the electrode 6 within the reflective cup portion 7 is less than 5 μm, then it has a poor outward appearance and a satisfactory heat discharge performance cannot be obtained. If, on the other hand, the thickness of the electrode 6 within the reflective cup portion 7 exceeds 100 μm, then the degree of flatness is poor even if smoothing processing is performed after sintering (described below), and there is a possibility that it will be difficult to mount a light emitting device.

Furthermore, by additionally performing a smoothing step in order to regularize the shape of the electrode 6 within the reflective cup portion 7 after the electrode 6 has been sintered, an even better heat discharge performance, flatness of the reflective cup portion, and light emission amount can be obtained.

As is shown in FIG. 1, the basic structure of the light emitting device module can be formed by providing a porcelain enamel substrate 1 mounting a light emitting device that is formed by covering a surface of a core metal 4 with a porcelain enamel layer 5, and by providing a bowl-shaped reflective cup portion 7, and by providing electrodes for energizing a light emitting device 3 such as an LED on the light emitting device mounting surface. The light emitting device 3 is then mounted on the bottom surface of the reflective cup portion 7 of this substrate. However, the present invention is not limited to this structure.

In the example shown in FIG. 1, a light emitting device 3 is mounted on one of a pair of electrodes 6 and 6 that extend as far as the bottom surface of the reflective cup portion 7, while being electrically connected by a metal wire 8 to the other electrode. The reflective cup portion 7 on which the light emitting device 3 is mounted is sealed by a sealing resin 9.

The reflective cup portion 7 is formed in a groove shape or in a bowl shape that is made up of a flat bottom surface and sloping surfaces. The angle of inclination of the sloping surfaces is approximately from 30° to 70°, and is preferably from 40° to 60°.

The material that is used for the core metal 4 that makes up the porcelain enamel substrate 1 for mounting a light emitting device is not particularly limited provided that it is a metal on whose surface the porcelain enamel layer 5 can be strongly formed and, for example, a low carbon steel sheet or the like may be used. The porcelain enamel layer 5 is formed by baking glass powder onto a surface of the core metal 4. Moreover, it is desirable for the electrode 6 to be formed by employing a method in which a conductive paste such as a silver paste or copper paste is printed in a predetermined pattern using a pad printing method, and is then baked.

An LED is preferable as the light emitting device 3 that is mounted on the porcelain enamel substrate 1 for mounting a light emitting device. When a light emitting device module 2 is used in an illumination device, a white LED is preferable as the light emitting device 3. As this white LED, it is desirable to use a white LED or the like that is obtained by combining, for example, a blue LED that is made from a gallium nitride (GaN) based semiconductor with one or two or more types of fluorescent substance that are excited by blue light and emit visible light other than blue light such as, for example, yellow light. Note that it is desirable that the fluorescent substance is used by being mixed or dispersed in the sealing resin 9 that is used to seal the light emitting device mounted on the substrate.

The light emitting device 3 is mounted on the bottom surface of the reflective cup portion 7. One electrode terminal of the light emitting device 3 is electrically connected to one electrode 6, while the other electrode terminal of the light emitting device 3 is electrically connected by a metal wire 8 (i.e., a bonding wire) to the adjacent other electrode 6.

Next, a method of manufacturing the above described porcelain enamel substrate 1 for mounting a light emitting device as well as the light emitting device module 2 which employs this porcelain enamel substrate 1 will be described.

Firstly, in order to manufacture the core metal 4, the metal plate used for manufacturing the core metal is prepared. This metal plate is cut to the desired shape and then undergoes further machine working so that the desired number of reflective cup portions 7 where light emitting devices are to be mounted are formed.

Next, the core metal 4 is immersed in a solution obtained by dispersing glass powder in a suitable solvent. Counter electrodes are then placed in the vicinity of this core metal 4, and voltage is then applied between the core metal 4 and the relevant counter electrode so that the glass powder is electrodeposited on the surface of the core metal 4. After this electrode position, the core metal 4 is removed from the solution and dried. It is then placed in a heating furnace and is heated to a predetermined temperature range. As a result, the glass powder is baked onto the surface of the core metal 4 thereby forming a porcelain enamel layer 5. The manufacturing of the porcelain enamel substrate is thus completed.

Next, using a pad printing method, a conductive paste such as silver paste or copper paste is printed to correspond to the formation pattern of the electrode 6, and this is then dried. The coating amount is adjusted such that the thickness of the electrode 6 inside the reflective cup portion 7 after baking is within a range of 5 μm to 100 μm, and preferably within a range of 5 μm to 50 μm. Thereafter, the porcelain enamel substrate is baked so as to form the electrode 6 and the required circuit. By performing each of the above described steps, a porcelain enamel substrate 1 for mounting a light emitting device is obtained.

After the printed conductive paste has been baked, it is desirable for smoothing processing to be performed in which the baked electrode 6 is pressed by a pressing component that has a pressing surface that matches the surface configuration of the substrate, and preferably by a pressing component that has an elastic material as the pressing surface.

Next, a light emitting device 3 is mounted by die bonding onto the bottom surface of the reflective cup portion 7 of the porcelain enamel substrate 1 for mounting a light emitting device that has been manufactured in the manner described above. Wire bonding is then performed so that the light emitting device 3 is electrically connected to the electrode 6 by a metal wire 8. Thereafter, the interior of the reflective cup portion 7 is filled with a protective resin or with a resin in which a fluorescent substance has been mixed or dispersed. This resin is then cured by sealing the light emitting device 3 with resin. The light emitting device module 2 is manufactured by this process.

EXAMPLE 1

A bar of low carbon steel having a thickness of 1.5 mm was cut to a size of 10×10 mm. A core metal was then manufactured by forming a reflective cup portion having a depth of 0.6 mm, a bottom portion diameter of 2.0 mm, and an angle of inclination of 45° by drilling and metal stamping.

Next, glass powder was baked onto the surface of the core metal in which the reflective cup portion was formed, so as to form a porcelain enamel layer having a thickness of 50 μm and manufacturing a porcelain enamel substrate.

Next, using silver paste as a conductive paste, an electrode pattern was printed using pad printing onto the surface of the porcelain enamel substrate. Note that the manufacturing of the electrode was performed using a method disclosed in Japanese Unexamined Patent Application, First Publication No. H8-295005.

After the electrode pattern was printed using silver paste, it was dried. The method used to dry the conductive paste included a step in which the printed surface on which the conductive paste had been printed was dried using a far infrared drying furnace until the conductive paste was dry to touch, and a step in which the printed object on which the conductive paste had been touch dried was completely dried in a hot air circulation furnace. Specifically, firstly, a printed object was dried using a far infrared drying furnace until the conductive paste was dry to touch. Dry-to-touch is also known as nominal drying, and indicates a state in which a conductive paste that has been printed or coated is dry enough so as to not adhere thereto when touched by a finger. Far infrared rays are able to easily permeate into the interior of a substance, and are able to heat conductive paste from the interior thereof. Accordingly, they make it possible to dry to a certain extent both the surface and interior of a conductive paste in a short period of time. Because of this, evaporation of the conductive paste solvent is insufficient, and the reaction of the resin is also incomplete. This means that conventional characteristics for hardness of the coating film, adhesiveness, conductivity and the like cannot be obtained, however, a sufficient level of dryness is achieved for the printed objects to be stacked. The dry-to-touch printed objects were then stacked and completely dried in a hot air circulation furnace.

The amount of silver paste being printed was adjusted such that the thickness thereof was within a target range of 5 μm to 100 μm. The degree of flatness, the external appearance, and the heat discharge performance of the bottom surface of the reflective cup portion at this time were evaluated. The results of the evaluation of the degree of flatness and external appearance are shown in Table 1.

The evaluation of the degree of flatness of the reflective cup portion was performed as follows.

The area required for mounting a light emitting device was taken as an angle of 500 μm at a position in the center of the bottom surface of the reflective cup portion, and the maximum value and minimum value of the height within this area were recorded. The target value was within 10 μm and acceptability was determined at that value.

When the average thickness of the silver paste on the cup bottom surface was from 5 μm to 50 μm, it was found that a sufficient degree of flatness was obtained without smoothing having to be performed after the electrode was baked, and neither were there any problems in the external appearance (Examples 1 to 4). In contrast, when the average thickness of the silver paste on the cup bottom surface was thicker than 50 μm, it was found that a sufficient degree of flatness was not obtained in the post baking state (Examples 5 and 7, Comparative example 1). Therefore, after baking, a step to press the electrode using a medium having elasticity was added, and the degree of flatness was then measured. As a result, it was found that a sufficient degree of flatness was obtained for an average thickness of the silver paste on the cup bottom surface of up to 100 μm (Examples 6 and 8). However, when the average thickness of the silver paste was 300 μm, it was found that a sufficient degree of flatness was not obtained even when the smoothing step was performed (Comparative example 2).

When, however, the average thickness of the electrode on the cup bottom surface was 2.2 μm, it was found that portions of the porcelain enamel layer, which was the bottommost layer, were peeling off so that the external appearance was unacceptable. In particular, locations where the light emitting device was mounted became disconnected when the bottom layer was peeled off.

Namely, less than 5 μm: unacceptable external appearance

5 μm to 50 μm: acceptable degree of flatness obtained without having to perform smoothing after baking the electrode

TABLE 1

| | Smoothing step performed? | Average thickness [μm] of electrode on cup bottom surface (measured value) | Degree of flatness of reflective cup bottom surface (diagnostic criterion: within 10 μm) | External appearance |
|---|---|---|---|---|
| Example 1 | No | 4.9 | OK | Good |
| Example 2 | No | 11 | OK | Good |
| Example 3 | No | 24 | OK | Good |
| Example 4 | No | 50 | OK | Good |
| Example 5 | No | 75 | NG (difference between top and bottom: 13 μm) | Good |
| Example 6 | Yes | 72 | OK | Good |
| Example 7 | No | 104 | NG (difference between top and bottom: 19 μm) | Good |
| Example 8 | Yes | 101 | OK | Good |
| Comparative example 1 | No | 303 | NG (difference between top and bottom: 27 μm) | Good |
| Comparative example 2 | Yes | 297 | NG (difference between top and bottom: 14 μm) | Good |
| Comparative example 3 | No | 2.2 | OK | Poor |

50 μm to 100 μm: acceptable degree of flatness obtained by performing smoothing after baking the electrode more than 100 μm: acceptable degree of flatness was not obtained The evaluation of the heat discharge performance was performed in the following manner.

A blue light emitting device (Product name: XB900, manufactured by Cree, Inc.) was die-bonded using silver paste onto an electrode that was formed on a porcelain enamel substrate, and was then bonded to a facing electrode using metal wire. Thereafter, sealing resin (thermosetting epoxy resin) was inserted into the reflective cup portion until the top portion thereof was sufficiently uplifted by surface tension.

Initially, the above described light emitting device module was left in a constant temperature state, and the voltage value after one second was measured at a low current value (10 mA). Here, the reason for using a low current value was that, if a high current was supplied, then the device itself would emit heat, so that the temperature of the device itself would be added to the atmospheric temperature. A graph was then made showing the relationship between the voltage value and the temperature.

The atmospheric temperature was set to room temperature (25° C.) and 350 mA of current was supplied at that time for one hour. The current value was then lowered to 10 mA, and the voltage value at that time was read.

The result when the voltage value was converted into a temperature using the relationship between the voltage value and the temperature was taken as the temperature (A) of the light emitting device, while the temperature (B) of the rear surface of the substrate was also measured at the same time by thermocoupling.

A thermal resistance value was determined by dividing a temperature difference between the light emitting device and the substrate rear surface (A-B) by the supplied power (i.e., current×voltage).

As a result, it was found that when the average thickness of the silver paste on the bottom surface of the reflective cup portion was not less than 5 μm, the thermal resistance was substantially constant at 17 to 18° C./W. However, when the average thickness of the electrode on the bottom surface of the reflective cup portion was 2.2 μm, then each location was different and suitable measurements could not be obtained. Namely, when the average thickness of the electrode on the cup bottom surface was 2.2 μm, the temperature of the substrate was not uniform in a direction parallel to the substrate, and a good heat discharge performance was not obtained.

From the above results it was confirmed that an appropriate thickness for an electrode on a porcelain enamel substrate for mounting a light emitting device which has a reflective cup portion is within a range of 5 μm to 50 μm. Moreover, if, after the electrode has been baked, it is made even smoother by adding a smoothing step in which the shape of the electrode inside the reflective cup portion is made even, then the suitable thickness for an electrode on a porcelain enamel substrate for mounting a light emitting device which has a reflective cup portion was increased to 100 μm.

EXAMPLE 2

Using copper paste as the conductive paste, a porcelain enamel substrate having a reflective cup portion was manufactured in the same way as in Example 1. Specifically, a bar of low carbon steel having a thickness of 1.5 mm was cut to a size of 10×10 mm. A reflective cup portion having a depth of 0.6 mm, a bottom portion diameter of 2.1 mm, and an angle of inclination of 45° was then molded, and the surface of the metal plate was then covered by glass to a thickness of 50 μm. Next, using copper paste as a conductive paste, an electrode was formed using pad printing and this was then dried.

Next, the amount of copper paste being printed was adjusted such that the thickness thereof was within a target range of 2 μm to 300 μm. The degree of flatness, the external appearance, and the heat discharge performance of the bottom surface of the reflective cup portion at this time were evaluated. The results of the evaluation are shown in Table 2.

TABLE 2

|  | Smoothing step performed? | Average thickness [μm] of electrode on cup bottom surface (measured value) | Degree of flatness of reflective cup bottom surface (diagnostic criterion: within 10 μm) | External appearance |
| --- | --- | --- | --- | --- |
| Example 9 | No | 5.0 | OK | Good |
| Example 10 | No | 50 | OK | Good |
| Example 11 | No | 73 | NG (difference between top and bottom: 14 μm) | Good |
| Example 12 | Yes | 70 | OK | Good |
| Example 13 | No | 100 | NG (difference between top and bottom: 17 μm) | Good |
| Example 14 | Yes | 97 | OK | Good |
| Comparative example 4 | No | 306 | NG (difference between top and bottom: 26 μm) | Good |
| Comparative example 5 | Yes | 299 | NG (difference between top and bottom: 13 μm) | Good |
| Comparative example 6 | No | 2.6 | OK | Poor |

As a result, it was found that, in exactly the same way as when silver paste was used, less than 5 μm: unacceptable external appearance 5 μm to 50 μm: acceptable degree of flatness obtained without having to perform smoothing after baking the electrode 50 μm to 100 μm: acceptable degree of flatness obtained by performing smoothing after baking the electrode more than 100 μm: acceptable degree of flatness was not obtained.

The heat discharge performance was exactly the same. When the average thickness of the paste on the cup bottom surface was not less than 5 μm, the thermal resistance was substantially constant at 17 to 18° C./W. However, when the average thickness of the electrode on the cup bottom surface was 2.6 μm, then each location was different and suitable measurements could not be obtained.

Namely, when the average thickness of the electrode on the cup bottom surface was 2.6 μm, the temperature of the substrate was not uniform in a direction parallel to the substrate, and a good heat discharge performance was not obtained.

In the above described embodiment, a description is given of when one reflective cup portion is manufactured on a porcelain enamel substrate, however, it is also possible to provide a plurality of reflective cup portions on a porcelain enamel substrate.

The sealing resin may be a thermosetting or ultraviolet curable epoxy resin or may be a silicone resin.

The light emitting device that is used in the present invention may be a blue light emitting device or a green light emitting device such as a nitride compound semiconductor, or may be a red or infrared light emitting device such as those typified by GaP.

Moreover, it is also possible to mount a blue light emitting device such as a nitride compound semiconductor, and to insert into the sealing resin a blue-excited yellow light emitting fluorescent substance such as, for example, a cerium-reactivated yttrium-aluminum-garnet fluorescent substance, so as to form a white LED. In particular, when a fluorescent substance or the like is dispersed inside a reflective cup portion, because the light becomes diffused, a large quantity of light strikes the reflective cup portion so that the reflection from the surface of the reflective cup portion becomes even more important.

While the present invention has been particularly shown and described with reference to exemplary embodiments thereof, it will be understood by those of ordinary skill in the art that various changes in form and details may be made therein without departing from the spirit and scope of the present invention as defined by the following claims.

INDUSTRIAL APPLICABILITY

An example of a practical application of the present invention is its favorable use for porcelain enamel substrates for mounting light emitting devices that are used to mount a plurality of light emitting devices such as LED.

What is claimed is:

1. A method of manufacturing a porcelain enamel substrate comprising:
    forming a porcelain enamel layer by baking a porcelain enamel material onto a core metal that is obtained by forming a reflective cup portion that has a flat bottom surface and a sloping portion that surrounds the bottom surface in a metal material;
    forming an electrode on a light emitting device mounting surface on which the reflective cup portion is provided by printing a conductive paste onto the porcelain enamel layer using a pad printing method and then baking the conductive paste; and
    smoothing the electrode after the electrode inside the reflective cup portion has been baked.

2. The method according to claim 1 wherein the thickness of the electrode within the reflective cup portion is within a range of 5 μm to 100 μm.

3. The method according to claim 1, wherein the thickness of the electrode within the reflective cup portion is within a range of 5 μm to 50 μm.

* * * * *